(12) United States Patent
Yang et al.

(10) Patent No.: US 11,150,269 B2
(45) Date of Patent: *Oct. 19, 2021

(54) PROBE HEAD FOR HIGH FREQUENCY SIGNAL TEST AND MEDIUM OR LOW FREQUENCY SIGNAL TEST AT THE SAME TIME

(71) Applicant: MPI CORPORATION, Chu-Pei (TW)

(72) Inventors: Hui-Pin Yang, Chu-Pei (TW); Shang-Jung Hsieh, Chu-Pei (TW); Yu-Wen Chou, Chu-Pei (TW); Ching-Fang Yu, Chu-Pei (TW); Huo-Kang Hsu, Chu-Pei (TW); Chin-Tien Yang, Chu-Pei (TW)

(73) Assignee: MPI CORPORATION, Chu-Pei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/990,283

(22) Filed: Aug. 11, 2020

(65) Prior Publication Data

US 2021/0048452 A1 Feb. 18, 2021

Related U.S. Application Data

(60) Provisional application No. 62/887,232, filed on Aug. 15, 2019, provisional application No. 62/896,716, filed on Sep. 6, 2019.

(30) Foreign Application Priority Data

Jun. 15, 2020 (TW) .................................. 109120056

(51) Int. Cl.
*G01R 1/073* (2006.01)
*G01R 1/067* (2006.01)

(52) U.S. Cl.
CPC ..... *G01R 1/07314* (2013.01); *G01R 1/06722* (2013.01); *G01R 1/06772* (2013.01)

(58) Field of Classification Search
CPC ............ G01R 1/07314; G01R 1/06722; G01R 1/06772
See application file for complete search history.

(56) References Cited

U.S. PATENT DOCUMENTS

| 6,247,939 | B1 * | 6/2001 | Bestul | ................ | H01R 13/2421 439/66 |
|---|---|---|---|---|---|
| 2004/0036493 | A1 * | 2/2004 | Miller | ................ | G01R 1/07314 324/754.14 |

(Continued)

*Primary Examiner* — Paresh Patel
(74) *Attorney, Agent, or Firm* — Birch, Stewart, Kolasch & Birch, LLP

(57) ABSTRACT

A probe head includes a probe seat, a first spring probe penetrating through upper, middle and lower dies of the probe seat for transmitting a first test signal, and at least two shorter second spring probes penetrating through the lower die for transmitting a second test signal with higher frequency. Two second spring probes are electrically connected in a way that top ends thereof are abutted against two electrically conductive contacts on a bottom surface of the middle die electrically connected by a connecting circuit therein. The lower die has a communicating space and at least two lower installation holes communicating therewith and each accommodating a second spring probe partially located in the communicating space. The probe head is adapted for concurrent high and medium or low frequency signal tests, meets fine pitch and high frequency testing requirements and prevents probe cards from too complicated circuit design.

18 Claims, 11 Drawing Sheets

(56) References Cited

U.S. PATENT DOCUMENTS

| | | | | |
|---|---|---|---|---|
| 2004/0061513 | A1* | 4/2004 | Sweet | G01R 1/06772 |
| | | | | 324/755.05 |
| 2005/0258843 | A1* | 11/2005 | Kazama | G01R 1/06722 |
| | | | | 324/756.03 |
| 2006/0066330 | A1* | 3/2006 | Yoshida | G01R 1/07314 |
| | | | | 324/756.03 |
| 2007/0111560 | A1* | 5/2007 | Kazama | G01R 1/0483 |
| | | | | 439/71 |
| 2007/0145990 | A1* | 6/2007 | Fukushima | G01R 1/045 |
| | | | | 324/755.05 |
| 2009/0311890 | A1* | 12/2009 | Nakayama | G01R 1/07371 |
| | | | | 439/91 |
| 2010/0041251 | A1* | 2/2010 | Nakayama | G01R 1/045 |
| | | | | 439/65 |
| 2012/0115366 | A1* | 5/2012 | Suzuki | G01R 1/0483 |
| | | | | 439/626 |
| 2017/0299631 | A1* | 10/2017 | Yamada | G01R 1/06722 |
| 2019/0206750 | A1* | 7/2019 | Chen | H01L 21/6836 |
| 2019/0369142 | A1* | 12/2019 | Treibergs | G01R 1/06772 |
| 2020/0393496 | A1* | 12/2020 | Sakurai | G01R 31/28 |
| 2021/0048451 | A1* | 2/2021 | Yang | G01R 1/07378 |

\* cited by examiner

PROBE HEAD FOR HIGH FREQUENCY SIGNAL TEST AND MEDIUM OR LOW FREQUENCY SIGNAL TEST AT THE SAME TIME

BACKGROUND OF THE INVENTION

1. Field of the Invention

The present invention relates generally to probe heads of probe cards and more particularly, to a probe head for high frequency signal test and medium or low frequency signal test at the same time.

2. Description of the Related Art

Due to market demand, the packaging and testing of integrated circuits (also referred to as ICs) are developed towards fine pitch and high frequency. However, because of limitations of testing machines, cost considerations or probes that are too long in length to enable high frequency testing, current vertical probe cards (also referred to as VPCs) mainly perform loopback test by some of the probes in the probe card for high frequency testing. This means high frequency signal is sent and received respectively by a transmission contact (TX) and a reception contact (RX) of a device under test (also referred to as DUT) itself, i.e. the aforementioned IC, and the signal is tested by the DUT itself. In other words, the high frequency test signal is not produced by the testing machine and not transmitted to the testing machine. It should be noted that the signals mentioned in this specification may be digital signals or analog signals.

In the case that spring probes (also known as pogo pins) are adopted in the vertical probe card, in order to meet the requirements of fine pitch and high frequency testing, the spring probes, including those manufactured by forming, MEMS (microelectromechanical systems) and other ways, need to be configured as thin and short as possible, which means the spring probes should be small in outer diameter and short in length. However, considering electrical properties, mechanical properties, force, operating stroke, lifetime and so on, it is difficult to make the spring probe thin when it is short and it is difficult to make it short when it is thin. In other words, the requirements of fine pitch and high frequency testing are difficult to be satisfied at the same time by a same spring probe.

The conventional probe card that can be used for high frequency signal test and medium or low frequency signal test is primarily provided with a switch circuit to enable a same set of probes to be switched between an electrical conduction manner for high frequency loopback test and another electrical conduction manner for transmitting medium or low frequency test signal from the testing machine. Such probe card is relatively more complicated in circuit design, and the probes should be sized to meet the requirement of high frequency testing, thereby difficult to meet the requirement of fine pitch. Besides, considering the IC design, the pitch between the contacts, i.e. the distance between the contacts' centers, for high frequency signals is usually larger than the pitch between the contacts for other signals. Therefore, even with the aforementioned switch circuit, it is still difficult to apply the same probe to high frequency testing and medium or low frequency testing.

SUMMARY OF THE INVENTION

The present invention has been accomplished in view of the above-noted circumstances. It is an objective of the present invention to provide a probe head which is adapted for high frequency signal test and medium or low frequency signal test at the same time, preventing probe cards from too complicated circuit design and meeting the requirements of fine pitch and high frequency testing at the same time.

To attain the above objective, the present invention provides a probe head for transmitting a first test signal and a second test signal higher in frequency than the first test signal. The probe head includes a probe seat, a first spring probe and at least two second spring probes. The probe seat includes an upper die, a lower die and a middle die disposed between the upper die and the lower die. The middle die has a bottom surface facing toward the lower die and at least one conducting unit which includes two electrically conductive contacts located on the bottom surface and a connecting circuit located inside the middle die and electrically connecting the two electrically conductive contacts. The first spring probe penetrates through the upper die, the middle die and the lower die for transmitting the first test signal. The at least two second spring probes penetrate through the lower die for transmitting the second test signal. Each of the second spring probes is shorter than the first spring probe and has a top end. The two second spring probes are electrically connected with each other in a way that the top ends thereof are abutted against the two electrically conductive contacts of the same conducting unit, respectively. The lower die has a top surface facing toward the middle die, a bottom surface opposite to the top surface and at least one lower installation hole unit penetrating through the top surface and the bottom surface of the lower die. The lower installation hole unit includes at least two lower installation holes and a communicating space communicating with the at least two lower installation holes. Each of the lower installation holes accommodates a second spring probe. Each of the second spring probes is partially located in the communicating space of the lower installation hole unit. For example, the lower installation hole unit may include a recess recessed from the top surface of the lower die to provide the communicating space, and the lower installation holes of the lower installation hole unit penetrate through a bottom surface of the recess and the bottom surface of the lower die. Alternatively, each of the lower installation holes may include an upper section and a lower section, and the communicating space is located between the upper section and the lower section of each of the lower installation holes, so that the upper section extends downwardly from the top surface of the lower die to the communicating space and the lower section extends upwardly from the bottom surface of the lower die to the communicating space.

In other words, the probe head of the present invention is provided with the relatively longer first spring probe penetrating through the whole probe seat and the relatively shorter second spring probes penetrating through only the lower die, and two second spring probes are electrically connected with each other through the connecting circuit inside the middle die, such as an internal wiring line of a multi-layer circuit board or the combination of internal wiring lines and electronic components, etc. As a result, the at least two second spring probes are adapted for probing the high frequency signal transmission contact (TX) and reception contact (RX) of the DUT for high frequency signal loopback test. For example, the middle die may have a conducting unit for being abutted by two second spring probes, and the two second spring probes is a set of transmission and reception probes for probing the transmission and reception contacts of the DUT, respectively. Alternatively, the middle die may have two conducting units for being abutted by two sets of transmission and reception probes, i.e. four second spring probes. The two conducting units are electrically insulated from each other. Two second spring probes connected by each conducting unit are adapted for probing the transmission and reception contacts of the DUT respectively, and the second spring probes connected with the two conducting units are arranged as a differential probe set for differential signaling. This means each of the two conducting units and the two second spring probes connected therewith form a signal transmitting path, and the two signal transmitting paths are adapted for transmitting differential signals opposite in phase. Besides, the first spring probe is adapted for probing other contacts of the DUT, such as ground contact, power contact and general medium or low frequency signal contacts. In this way, the second spring probes can be manufactured to be relatively shorter and thicker to satisfy the requirements for the electrical properties of high frequency testing, and the first spring probe can be manufactured to be relatively longer and thinner to meet the requirement of fine pitch in the condition with a plurality of first spring probes, so that the testing requirements of the whole IC are met. In addition, the communicating space of the lower installation hole unit of the lower die communicates with at least two lower installation holes, so that at least two second spring probes are partially located in the same communicating space of the lower installation hole unit, thereby benefiting the matching of capacitance and inductance and thereby enhancing the performance of the probe card. Especially in the aforementioned case that four second spring probes are arranged as a differential probe set for transmitting differential signals, locating two second spring probes not electrically connected with each other in the same communicating space of the lower installation hole unit benefits the matching of capacitance and inductance better.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
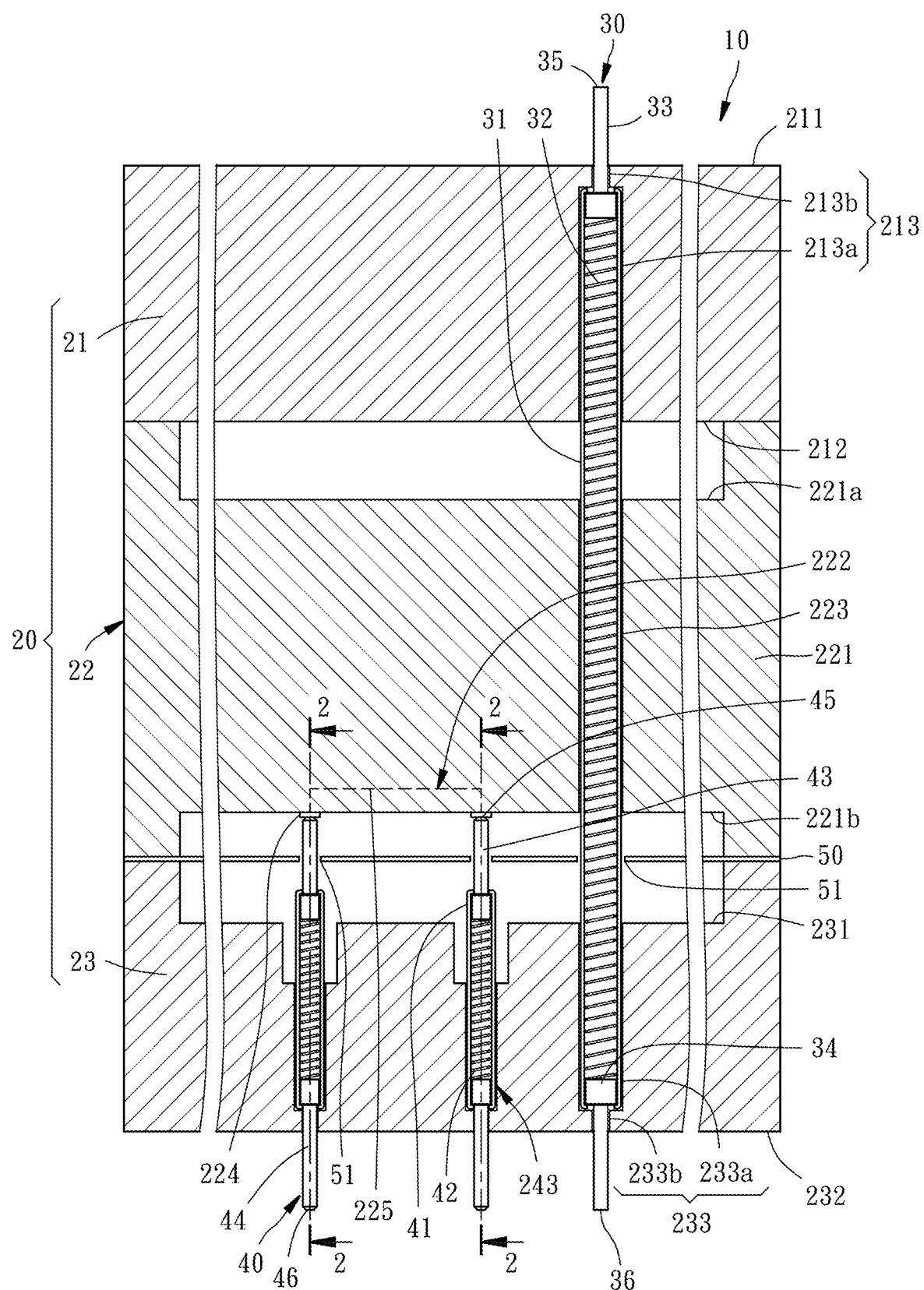
FIG. 1 is a schematic sectional view of a probe head for high frequency signal test and medium or low frequency signal test at the same time according to a first preferred embodiment of the present invention.

First of all, it is to be mentioned that same reference numerals used in the following embodiments and the appendix drawings designate same or similar elements or the structural features thereof throughout the specification for the purpose of concise illustration of the present invention. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between the two elements. It should be noticed that for the convenience of illustration, the components and the structure shown in the figures are not drawn according to the real scale and amount, and the features mentioned in each embodiment can be applied in the other embodiments if the application is possible in practice. In addition, the terms 'high frequency' and 'medium or low frequency' mentioned hereinafter are defined in a way that the transmission velocity of 'high frequency' signal is higher than the transmission velocity of 'medium or low frequency' signal. For example, if the transmission velocity of 'high frequency' signal is higher than or equal to 40 Gbps, the transmission velocity of 'medium or low frequency' signal is lower than 40 Gbps. But the present invention is unlimited to the aforementioned numerical value, which means the transmission velocity of 'high frequency' signal is unlimited to be higher than or equal to 40 Gbps.

Referring to FIG. 1, a probe head 10 for high frequency signal test and medium or low frequency signal test at the same time according to a first preferred embodiment of the present invention includes a probe seat 20, a plurality of first spring probes 30, a plurality of second spring probes 40 and a positioning film 50. The probe head in this embodiment or each following embodiment may actually have many first spring probes 30 and second spring probes 40, and the amount of the first spring probe 30 is usually much more than the amount of the second spring probe 40. The second spring probes 40 are paired in a way that every two of them are electrically connected with each other, and two pairs of second spring probes 40 are arranged as a differential probe set for differential signaling. For the simplification of the figures and the convenience of illustration, the figures of the present invention only show one first spring probe 30 and four second spring probes 40 arranged as a differential probe set, and the present invention is specified in the condition that the probe head 10 is provided with one first spring probe 30 and four second spring probes 40 for illustrative purpose.

The probe seat 20 includes an upper die 21, a middle die 22 and a lower die 23. In this embodiment and the following embodiments, each of the upper and lower dies 21 and 23 is composed of only one plate. However, according to the requirements of configuration and machining, each of the upper and lower dies 21 and 23 may be composed of a plurality of plates piled on one another, such as the lower die 23 shown in FIGS. 9 and 10. Each of the upper and lower dies 21 and 23 has a top surface 211 or 231 and a bottom surface 212 or 232, which face toward opposite directions. The middle die 22 is disposed between the bottom surface 212 of the upper die 21 and the top surface 231 of the lower die 23.

Specifically speaking, the middle die 22 in this embodiment includes a multi-layer circuit board 221. The multi-layer circuit board 221 has a top surface 221a and a bottom surface 221b, which face toward opposite directions. The top surface 221a and bottom surface 221b of the multi-layer circuit board 221 face toward the bottom surface 212 of the upper die 21 and the top surface 231 of the lower die 23, respectively. The multi-layer circuit board 221 may be a multi-layer ceramic substrate (also referred to as MLC), a multi-layer organic substrate (also referred to as MLO) or other kinds of circuit substrate composed of dielectric layers made of resin, bakelite, glass fiber, plastics and so on, and metallic layers made of copper foil and so on.

The upper, middle and lower dies 21, 22 and 23 have a plurality of upper, middle and lower through holes 213, 223 and 233, respectively. The figures of the present invention only show one upper through hole 213, one middle through hole 223 and one lower through hole 233. Each of the upper and lower through holes 213 and 233 has a larger radius portion 213a or 233a equal in inner radius to the middle through hole 223, and a smaller radius portion 213b or 233b smaller in inner radius than the larger radius portion 213a or 233a. The first spring probe 30 is inserted through an upper through hole 213, a middle through hole 223 and a lower through hole 233, which are coaxial with each other. This means the first spring probe 30 penetrates through the upper and bottom surfaces of the upper, middle and lower dies 21, 22 and 23. In this embodiment, the first spring probe 30 is a traditional spring probe, which includes a shell 31, a spring 32 disposed in the shell 31, and upper and lower shafts 33 and 34 abutted on two ends of the spring 32 respectively and extending out of top and bottom ends of the shell 31 respectively, wherein the spring 32 is a traditional coil spring processed by machining. However, the first spring probe 30 in the present invention is unlimited to the afore-described traditional spring probe, but may be a probe having a spring or other kinds of elastic structure processed by photolithography or other processing technologies, so that it is convenient to obtain the required elastic compression stroke and probing pressure by setting the coil number of the spring during the processing. The part of the lower shaft 34 of the first spring probe 30 protruding out of the bottom end of the shell 31 is inserted through the smaller radius portion 233b of the lower through hole 233, and the bottom end of the shell 31 is abutted on the boundary between the larger and smaller radius portions 233a and 233b of the lower through hole 233, so that the first spring probe 30 is prevented from falling out of the probe seat 20.

Figure 2:
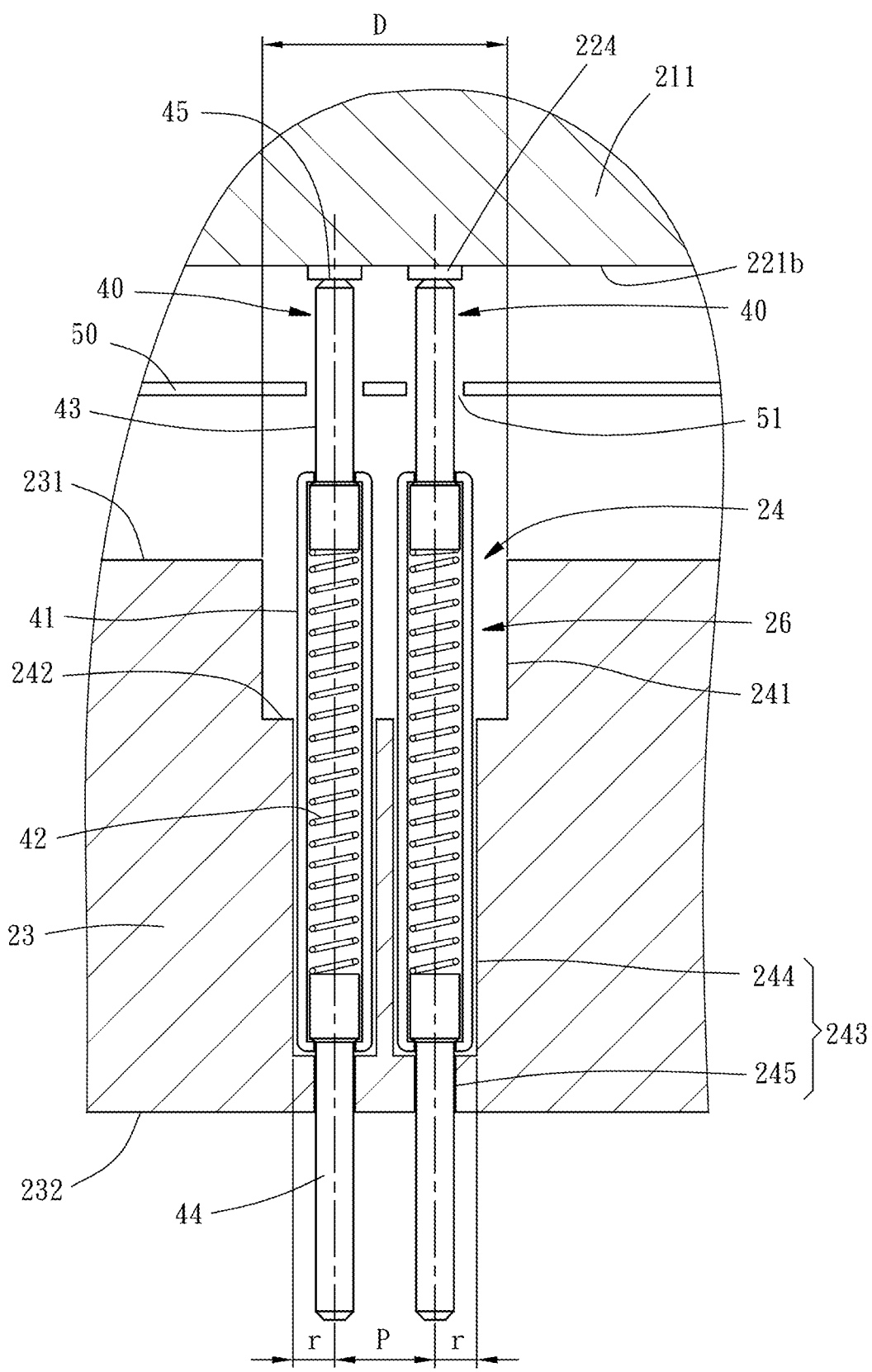
FIG. 2 is a partially sectional view taken along anyone of the lines 2-2 in FIG. 1.

In addition to the abovementioned lower through hole 233, the lower die 23 has a plurality of lower installation hole units 24, only two of which are shown in the figures of this embodiment. As shown in FIG. 2, each lower installation hole unit 24 includes a recess 241 recessed from the top surface 231 of the lower die 23, and two lower installation holes 243 penetrating through a bottom surface 242 of the recess 241 and the bottom surface 232 of the lower die 23. Each lower installation hole 243 includes a larger radius portion 244 connected with the bottom surface 242 of the recess 241, and a smaller radius portion 245 extending from the bottom end of the larger radius portion 244 to the bottom surface 232 of the lower die 23, wherein the inner radius of the smaller radius portion 245 is smaller than the inner radius of the larger radius portion 244. Each lower installation hole unit 24 accommodates two second spring probes 40 inserted through the two lower installation holes 243 respectively, and each second spring probe 40 is partially located in the recess 241. In this embodiment, the second spring probe 40 is a traditional spring probe, which includes a shell 41, a spring 42 disposed in the shell 41, and upper and lower shafts 43 and 44 abutted on two ends of the spring 42 respectively and extending out of top and bottom ends of the shell 41 respectively, wherein the spring 42 is a traditional coil spring processed by machining. However, the second spring probe 40 in the present invention is unlimited to the traditional spring probe, but may be a probe having a spring or other kinds of elastic structure processed by photolithography or other processing technologies. The lower shaft 44 of the second spring probe 40 is inserted through the smaller radius portion 245 of the lower installation hole 243, and the bottom end of the shell 41 of the second spring probe 40 is abutted on the boundary between the larger and smaller radius portions 244 and 245 of the lower installation hole 243, so that the second spring probe 40 is prevented from falling out of the probe seat 20.

The positioning film 50 is disposed between the bottom surface 221b of the multi-layer circuit board 221 of the middle die 22 and the top surface 231 of the lower die 23 and provided with a plurality of positioning holes 51. The first and second spring probes 30 and 40 are inserted through the positioning holes 51, respectively. In this way, the first and second spring probes 30 and 40 can be positioned by the positioning film 50 when being installed, making the assembly of the probe head 10 relatively easier.

In this embodiment, the middle die 22 has a plurality of conducting units 222, only one of which is shown in the figures of this embodiment. Every two second spring probes 40 are electrically connected with each other by a conducting unit 222. Each conducting unit 222 includes two electrically conductive contacts 224 located on the bottom surface 221b of the multi-layer circuit board 221 and a connecting circuit 225 located inside the multi-layer circuit board 221. Specifically speaking, the whole connecting circuit 225 is an internal wiring line located inside the multi-layer circuit board 221, which means the connecting circuit (internal wiring line) 225 is formed by the layered wiring inside the multi-layer circuit board 221. The two electrically conductive contacts 224 are disposed at two ends of the internal wiring line 225 respectively, thereby electrically connected with each other through the internal wiring line 225. The two second spring probes 40 are electrically connected with each other in a way that the top ends 45 thereof are abutted against the two electrically conductive contacts 224, respectively. Each conducting unit 222 and the two second spring probes 40 connected with the associated electrically conductive contacts 224 form a signal transmitting path, and two pairs of second spring probes 40 as shown in FIGS. 1 and 2 are arranged as a differential probe set for differential signaling. Specifically speaking, FIGS. 1 and 2 show four second spring probes 40 arranged in a matrix, and two signal transmitting paths are formed by the four second spring probes 40 and two conducting units 222. The two signal transmitting paths are adapted for transmitting differential signals opposite in phase, which means the differential signals have a phase difference of 180 degrees. However, the second spring probes 40 in the present invention are unlimited to be arranged as a differential probe set, which means there may be only a pair of second spring probes 40 electrically connected with each other as shown in FIG. 1 and each lower installation hole unit 24 may have only one lower installation hole 243.

When the assembly of the above-described probe head 10 is accomplished, the top end 35 of the first spring probe 30 protrudes out of the top surface 211 of the upper die 21. After that, the top surface 211 of the upper die 21 is fastened to a main circuit board (not shown), so that the probe head 10 and the main circuit board compose a probe card. Alternatively, the top surface 211 of the upper die 21 is fastened to a space transformer (not shown) and the space transformer is fastened to a main circuit board (not shown), so that the probe head 10, the space transformer and the main circuit board compose a probe card. At this time, the spring 32 of the first spring probe 30 is a little compressed to make the top end 35 of the first spring probe 30 draw back into the upper through hole 213 and abutted against an electric contact (not shown) of the main circuit board or the space transformer. The main circuit board is adapted to be electrically connected with a testing machine (not shown). Broadly speaking, the testing machine mentioned in the present invention may be the testing machine used in the integrated circuit testing factory for testing the DUTs. Further speaking, the testing machine may be a testing apparatus capable of transmitting high frequency test signals.

As a result, when the bottom end 36 of the first spring probe 30 contacts an electric contact of a DUT (not shown), the first spring probe 30 is adapted to transmit test signal between the testing machine and the DUT. Because the first spring probe 30 is relatively longer in length, it is relatively more suitable to transmit ground signal, power signal or general medium or low frequency signal. Besides, two of the four second spring probes 40 serve as signal transmitting probes (TX probes) for probing high frequency signal transmission contacts (TX) of the DUT, and the other two second spring probes 40 serve as signal receiving probes (RX probes) for probing high frequency signal reception contacts (RX) of the DUT. Further speaking, the two second spring probes 40 shown in FIG. 1 may be respectively a positive TX probe and a positive RX probe, or a negative TX probe and a negative RX probe, and the two second spring probes 40 shown in FIG. 2 may be respectively a positive TX probe and a negative TX probe, or a positive RX probe and a negative RX probe. The aforementioned term 'positive' means the associated probe transmits the signal having positive phase, and the aforementioned term 'negative' means the associated probe transmits the signal having negative phase. In the case that the probes are not used to transmit differential signals, the two second spring probes 40 electrically connected with each other through the conducting unit 222 as shown in FIG. 1 serve as a signal transmitting probe (TX probe) and a signal receiving probe (RX probe) respectively, the bottom ends 46 of which are adapted to contact high frequency signal transmission contact (TX) and reception contact (RX) of the DUT, respectively. In this way, a high frequency test signal can be outputted from the high frequency signal transmission contact of the DUT and transmitted to the high frequency signal reception contact of the DUT through a second spring probe 40 (TX probe), an electrically conductive contact 224, the internal wiring line 225, the other electrically conductive contact 224 and the other second spring probe 40 (RX probe) in order, to perform high frequency signal loopback test. Therefore, the second spring probe 40 can be manufactured to be relatively shorter and thicker to satisfy the requirements of the electrical properties of high frequency testing, and the first spring probe 30 can be manufactured to be relatively longer and thinner to meet the requirement of fine pitch, so that the testing requirements of the whole IC are met.

It can be known from the above description that the probe head 10 of the present invention uses the relatively longer first spring probe 30 penetrating through the whole probe seat 20 to perform medium or low frequency signal test, and uses the relatively shorter second spring probes 40 penetrating through only the lower die 23, and the circuits of the middle die 22 to perform high frequency signal loopback test. In other words, the probe head 10 transmits a first test signal by a first spring probe 30 and transmits a second test signal by at least two second spring probes 40, wherein the frequency of the second test signal is higher than the frequency of the first test signal, which means the first test signal is the aforementioned ground signal, power signal or general medium or low frequency signal and the second test signal is the aforementioned high frequency signal.

As described above, the types of the first and second spring probes 30 and 40 in the present invention are unlimited. However, the second spring probe 40 is much shorter in length than the first spring probe 30. Therefore, no matter what type the second spring probe 40 is, the elastic compression stroke and probing pressure thereof are relatively more difficult to be controlled. On the other hand, the first spring probe 30 is relatively longer, so the elastic compression stroke and probing pressure thereof are relatively easier to be controlled. Therefore, it is convenient to make the elastic compression stroke and probing pressure of the first spring probe 30 correspond to the elastic compression stroke and probing pressure of the second spring probe 40. Besides, there may be more other thick and short spring probes (not shown) configured similar to the second spring probe 40 and disposed around the second spring probes 40 for serving as ground probes, and the ground probes are electrically connected with ground wiring lines (not shown) inside the middle die 22, so that the high frequency signal transmitting paths are surrounded by ground signal transmitting paths and thereby have better electrical properties.

Figure 9:
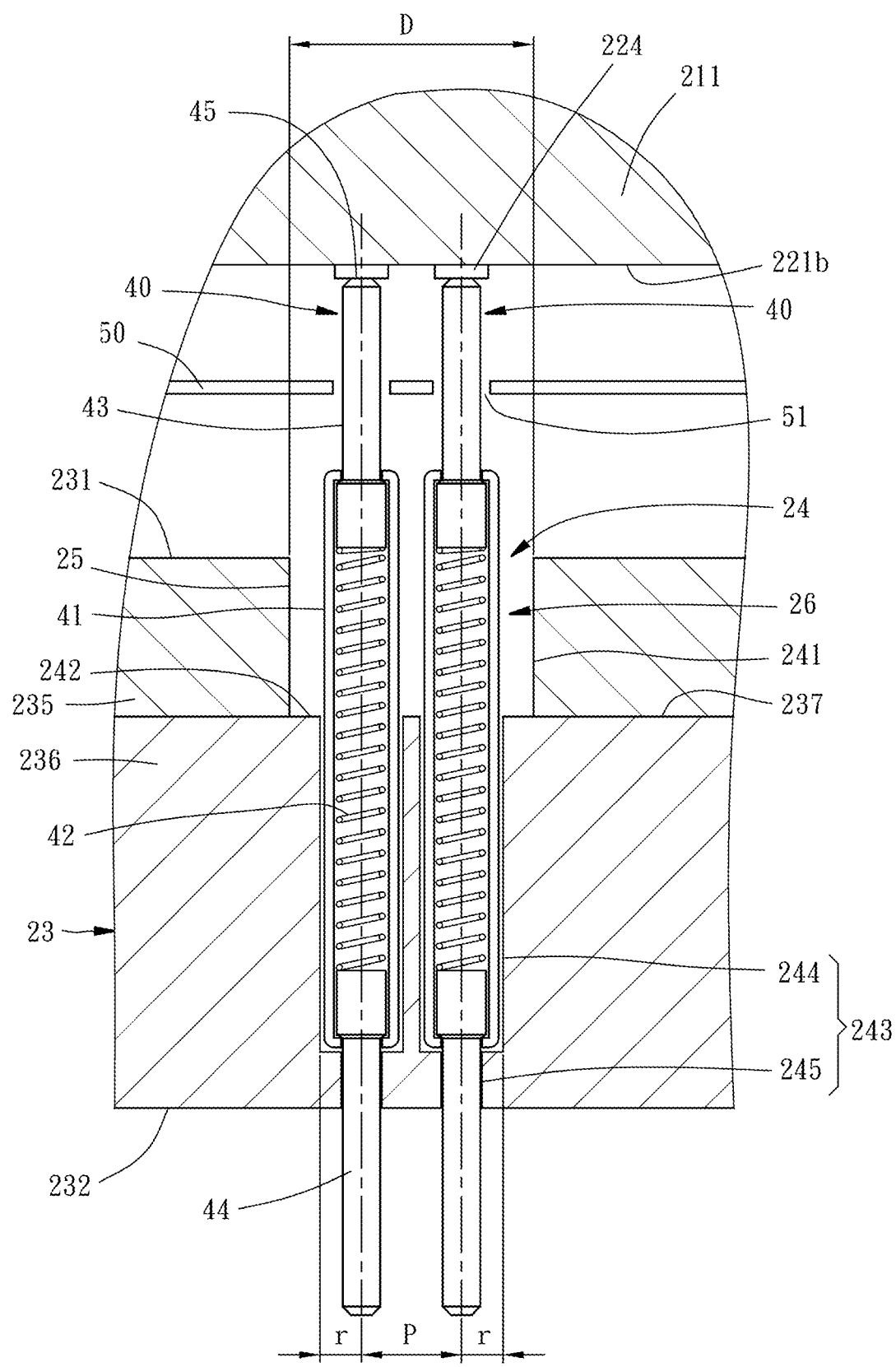
FIGS. 9 and 10 are similar to FIG. 2, but showing different types of a lower die of the probe head.

In the case shown in FIG. 1 and FIG. 2, two second spring probes 40 arranged as a differential pair for differential signaling are partially located in the same recess 241. This feature benefits the matching of capacitance and inductance, thereby enhancing the performance of the probe card. The shape of the recess 241 is unlimited. For example, the cross-section of the recess 241 may be shaped as a circle or a non-circle. The aforementioned non-circle includes a quadrilateral (e.g. square or rectangle), a polygon or an irregular shape. The length of the shortest side of the quadrilateral, polygon or irregular shape or the diameter of the circle D is larger than the sum of the pitch P between the second spring probes 40 located in the same lower installation hole unit 24, i.e. the second spring probes 40 arranged as a differential pair for differential signaling, and the largest diameter of the lower installation hole 243, which is the diameter of the larger radius portion 244 in FIG. 2, i.e. the twice of the radius r of the larger radius portion 244. That is, D>P+2r. However, the lower die 23 may be configured as shown in FIG. 9, wherein the aforementioned recess 241 is formed by upper and lower plates 235 and 236 piled on one another. Specifically speaking, the lower installation hole 243 for accommodating a single second spring probe 40 penetrates through the top surface 237 of the lower plate 236 and the bottom surface of the lower plate 236, i.e. the bottom surface 232 of the lower die 23. The upper plate 235 has an upper through hole 25 communicating with two lower installation holes 243, so that the upper through hole 25 and the top surface 237 of the lower plate 236 collectively form the aforementioned recess 241, in which the two second spring probes 40 are partially accommodated. This solution not only attains the aforementioned effect of enhancing the performance of the probe card, but also has the advantage of ease of machining.

Figure 10:
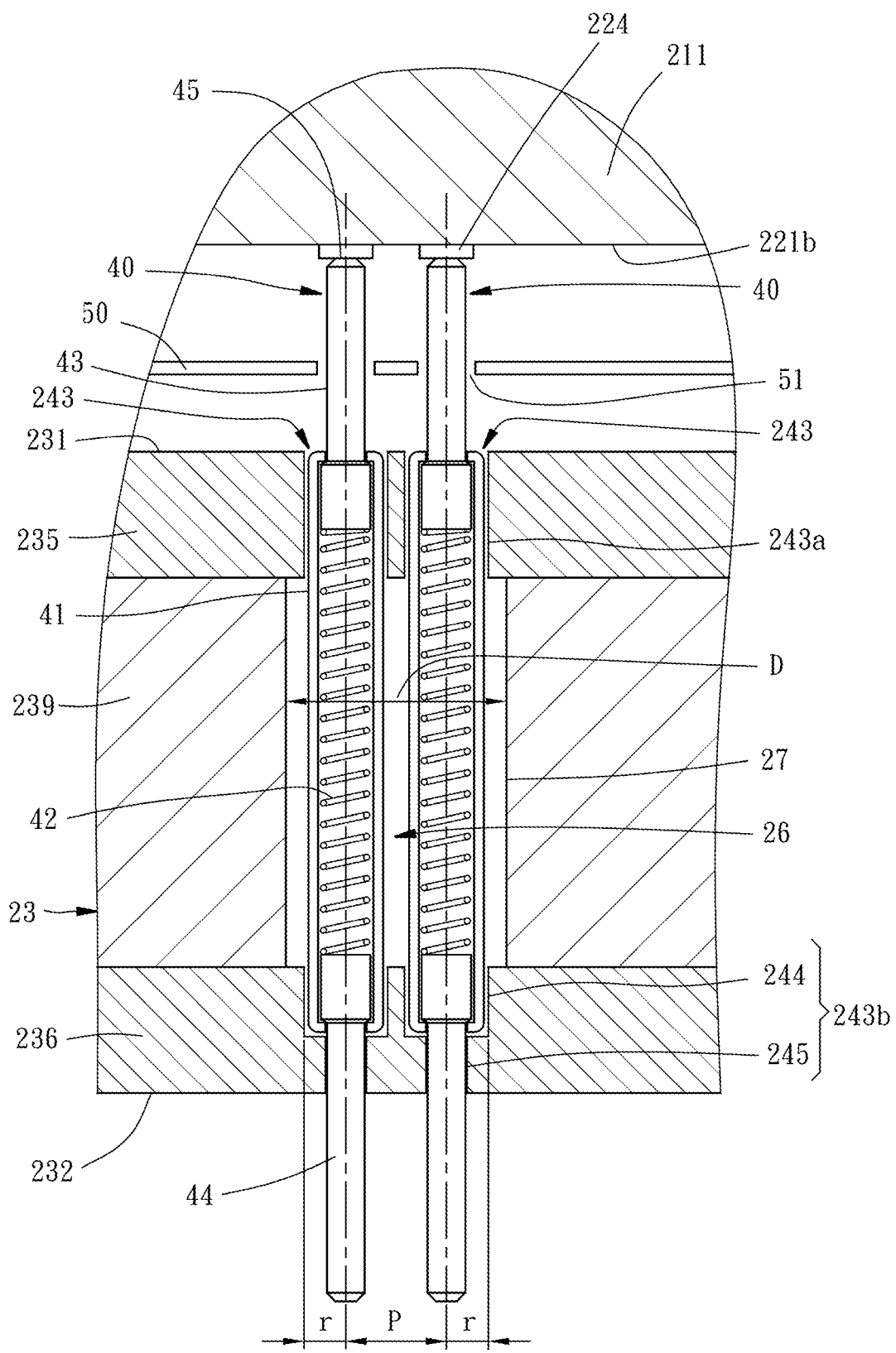

In the above-described types of the lower die 23 as shown in FIG. 2 and FIG. 9, the lower die 23 is provided with the recess 241 opened on the top surface 231 of the lower die 23 to have a communicating space 26 in the recess 241, so that two second spring probes 40 arranged as a differential pair for differential signaling are partially located in the same communicating space 26, thereby enhancing the performance of the probe card. However, as shown in FIG. 10, the communicating space 26 may be not opened, but provided inside the lower die 23. Specifically speaking, the lower die 23 includes a lower plate 236, a middle plate 239 and an upper plate 235 piled in order, and each lower installation hole 243 includes an upper section 243a penetrating through the upper plate 235 and a lower section 243b penetrating through the lower plate 236 and including the larger radius portion 244 and the smaller radius portion 245. The middle plate 239 has a middle through hole 27 wherein the communicating space 26 is provided. The communicating space 26 is located between the upper section 243a and the lower section 243b of each of the lower installation holes 243. The upper section 243a extends downwardly from the top surface 231 of the lower die 23 to the communicating space 26, and the lower section 243b extends upwardly from the bottom surface 232 of the lower die 23 to the communicating space 26. Such communicating space 26 hidden inside the lower die 23 can also attain the aforementioned effect of enhancing the performance of the probe card, and such lower die 23 has a better support effect to the probes. Like the above-described recess 241, the cross-section of the middle through hole 27 shown in FIG. 10 may be shaped as a circle or a non-circle. The aforementioned non-circle includes a quadrilateral (e.g. square or rectangle), a polygon or an irregular shape. The length of the shortest side of the quadrilateral, polygon or irregular shape or the diameter of the circle D is larger than the sum of the pitch P between the second spring probes 40 located in the same lower installation hole unit 24, i.e. the second spring probes 40 arranged as a differential pair for differential signaling, and the largest diameter of the lower installation hole 243, which is the diameter of the larger radius portion 244 in FIG. 10, i.e. the twice of the radius r of the larger radius portion 244. That is, D>P+2r.

It should be noted that the communicating space 26 mentioned in the present invention is a part of the lower installation hole unit 24. The communicating space 26 directly communicates with only the lower installation holes 243 included in the lower installation hole unit 24 which the communicating space 26 belongs to, but not directly communicates with the other lower installation holes 243 or the lower through holes 233, which don't belong to the same lower installation hole unit 24. Therefore, the communicating space 26 accommodates only second spring probes 40. Besides, the lower installation hole unit 24 mentioned in the present invention is defined as being penetrated through the top surface 231 and bottom surface 232 of the lower die 23, which means the top end of the lower installation hole unit 24 is located on the top surface 231. It can be known from the figures of the present invention that the lower die 23 may, but not necessarily, have a space communicating with all the lower installation hole units 24 and lower through holes 233. The space is located above the top surface 231 of the lower die 23, and all the first and second spring probes 30 and 40 are partially located in the space. From the afore description, it is understandable that the space is not a part of any single lower installation hole unit 24 and doesn't communicate with only the lower installation holes 243 included in one lower installation hole unit 24. Therefore, the space above the top surface 231 of the lower die 23 can't be regarded as the communicating space 26 mentioned in the present invention. In other words, in the present invention the part of the probe for transmitting high frequency loopback test signal, i.e. second spring probe 40, located in the communicating space 26 is segregated from the probe for transmitting medium or low frequency signal, i.e. first spring probe 30 or fourth spring probe 62 in FIG. 11. That is, they are segregated by a part of the lower die 23 located therebetween.

Figure 3:
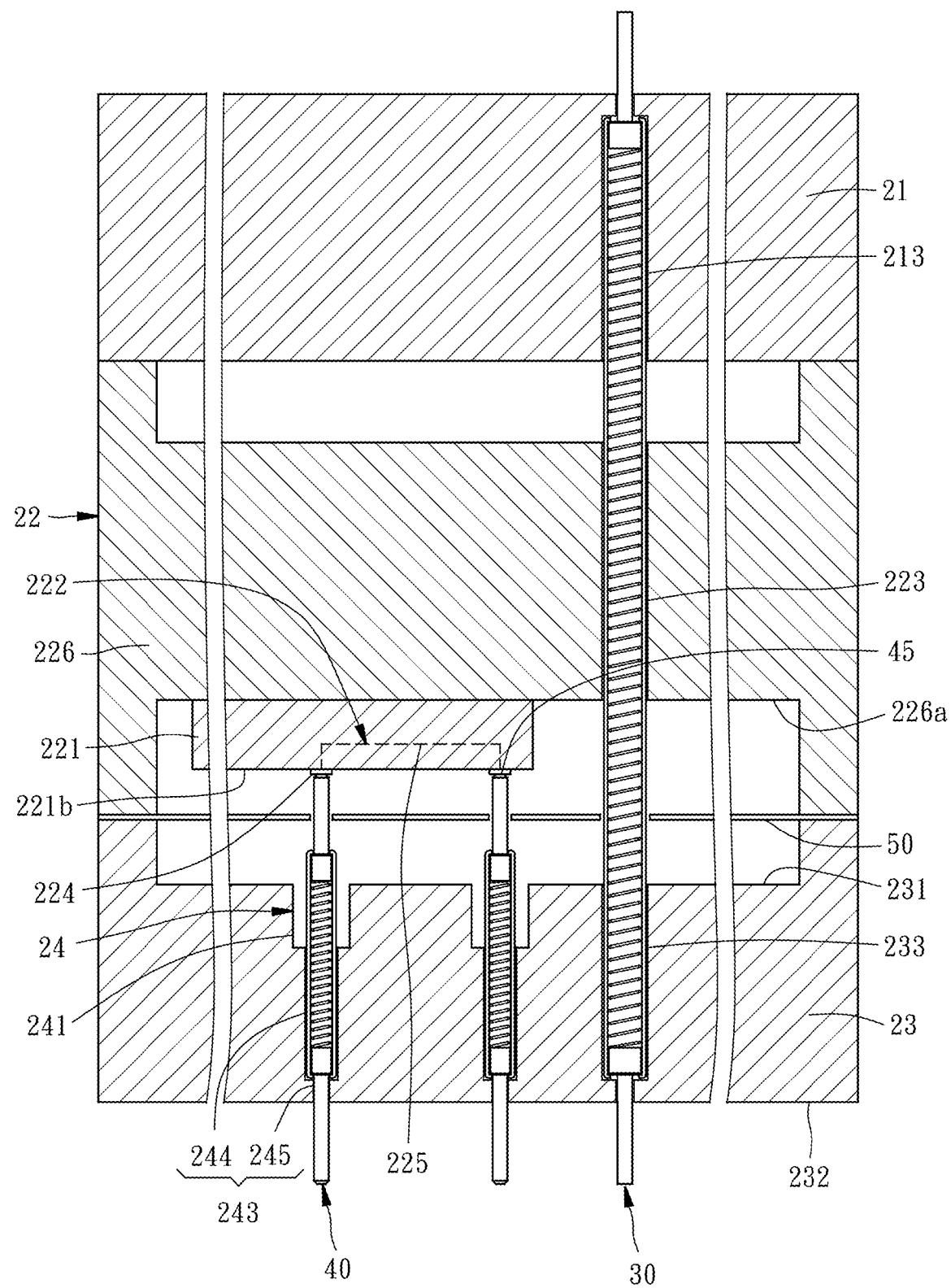
FIG. 3 is a schematic sectional view of a probe head for high frequency signal test and medium or low frequency signal test at the same time according to a second preferred embodiment of the present invention.

Referring to FIG. 3, a second preferred embodiment of the present invention is similar to the above-described first preferred embodiment, but the middle die 22 in the second preferred embodiment includes a multi-layer circuit board 221 and a machinable plate 226 made of machinable ceramic for example. The machinable plate 226 is disposed between the upper die 21 and the lower die 23. The multi-layer circuit board 221 is fixed on an installation surface 226a of the machinable plate 226 facing toward the lower die 23 by glue, screws (not shown), or any suitable fastening way. The multi-layer circuit board 221 in this embodiment is configured and functioned like the multi-layer circuit board 221 in the above-described first preferred embodiment, which means it has the conducting units 222 including the electrically conductive contacts 224 and the connecting circuits 225 to electrically connecting the second spring probes 40 one-to-one. However, the multi-layer circuit board 221 in this embodiment is relatively smaller in area and thickness and indirectly connected with the upper and lower dies 21 and 23 through the machinable plate 226.

Figure 4:
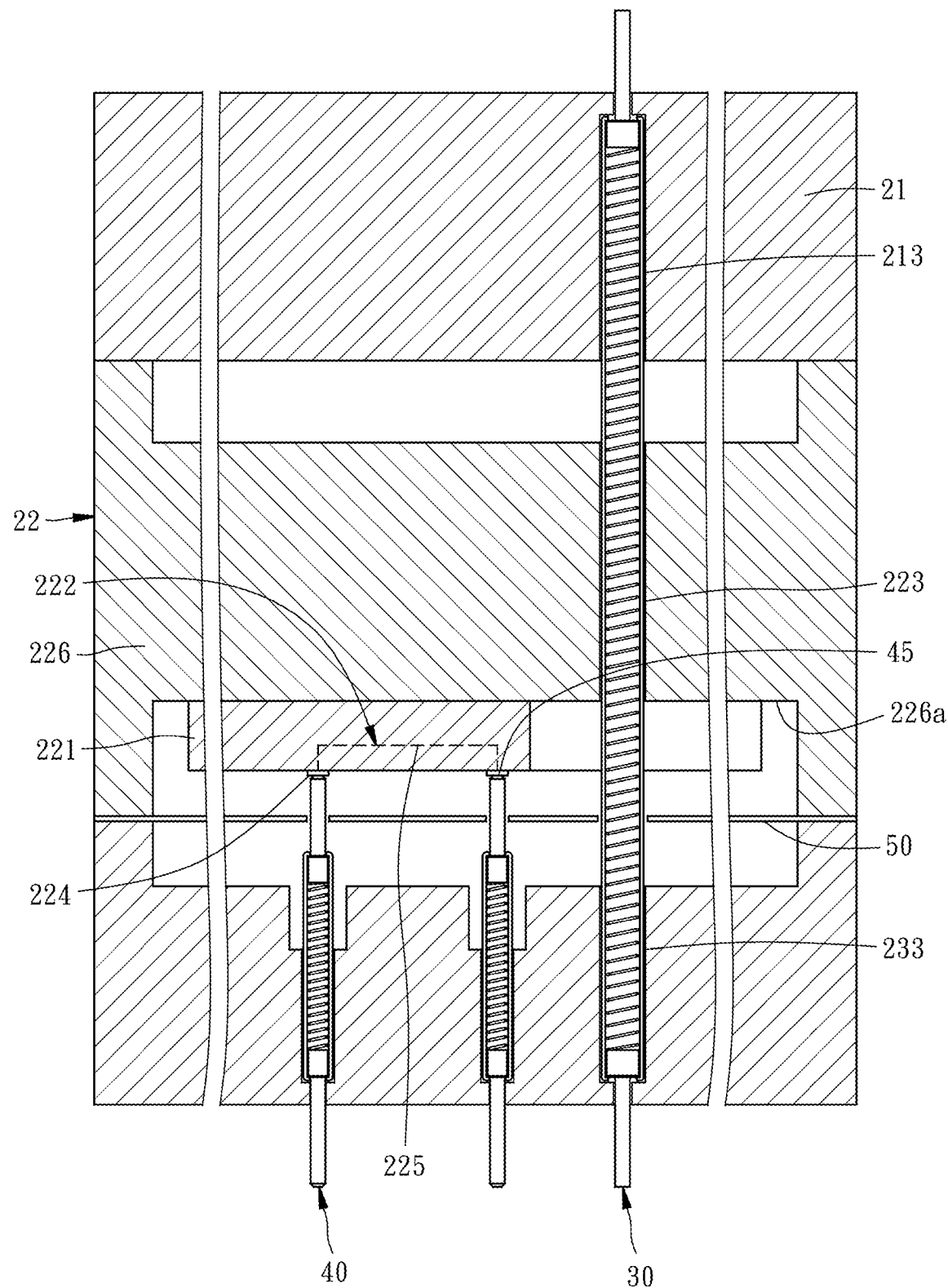
FIG. 4 is a schematic sectional view of a probe head for high frequency signal test and medium or low frequency signal test at the same time according to a third preferred embodiment of the present invention.
Figure 5:
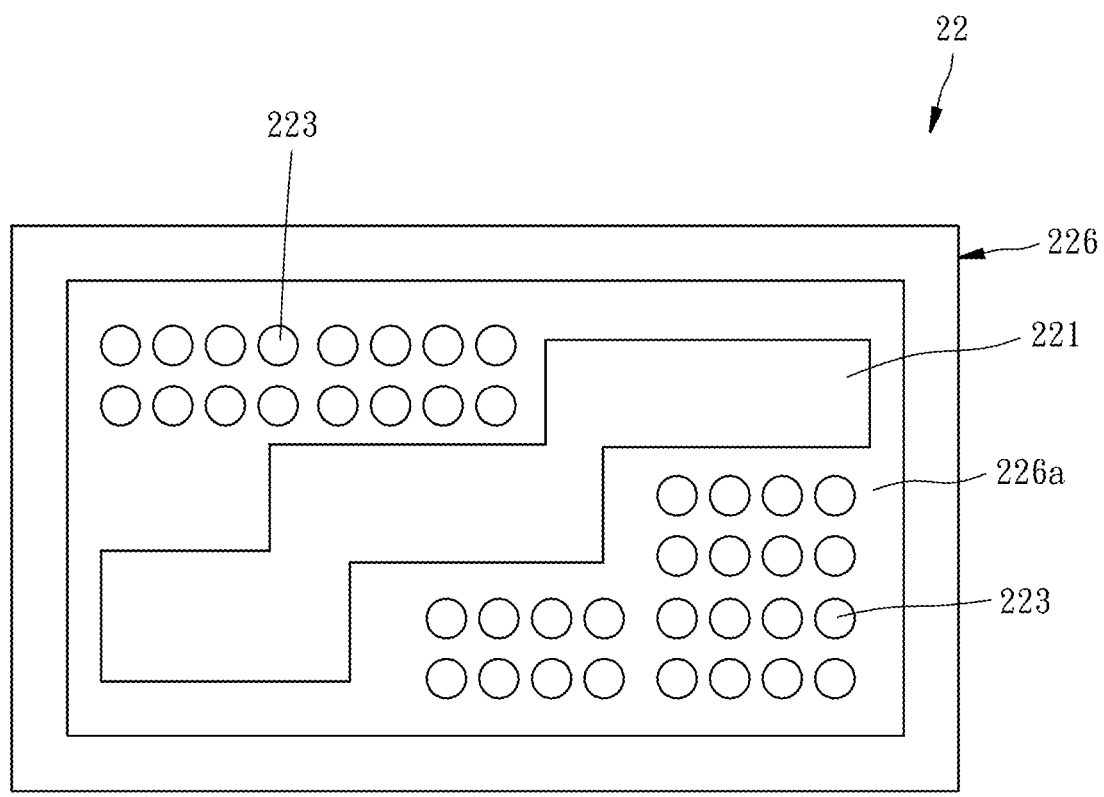
FIG. 5 is a schematic bottom view of a middle die of the probe head for high frequency signal test and medium or low frequency signal test at the same time according to the third preferred embodiment of the present invention.
Figure 6:
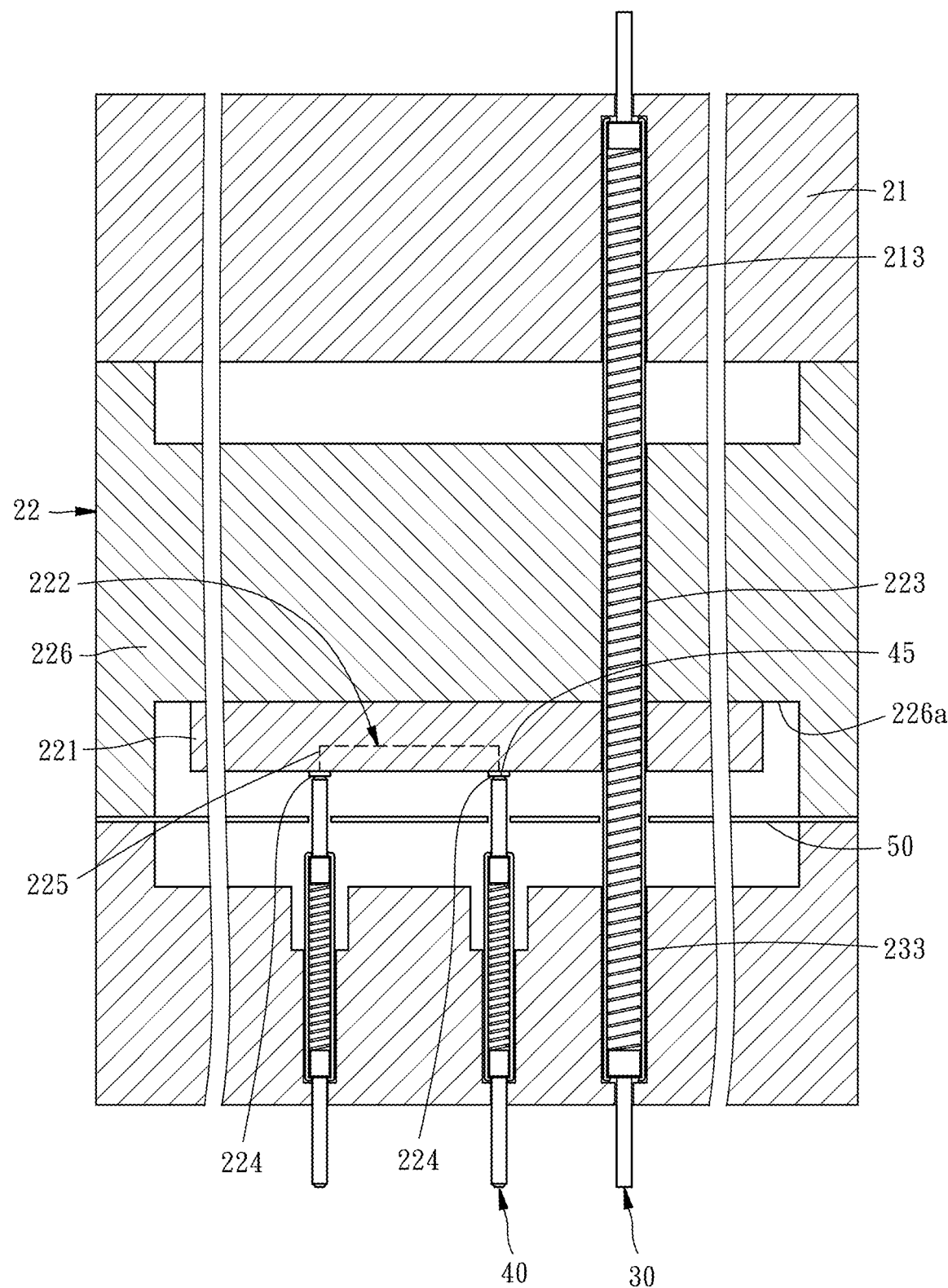
FIG. 6 is a schematic sectional view of a probe head for high frequency signal test and medium or low frequency signal test at the same time according to a fourth preferred embodiment of the present invention.
Figure 7:
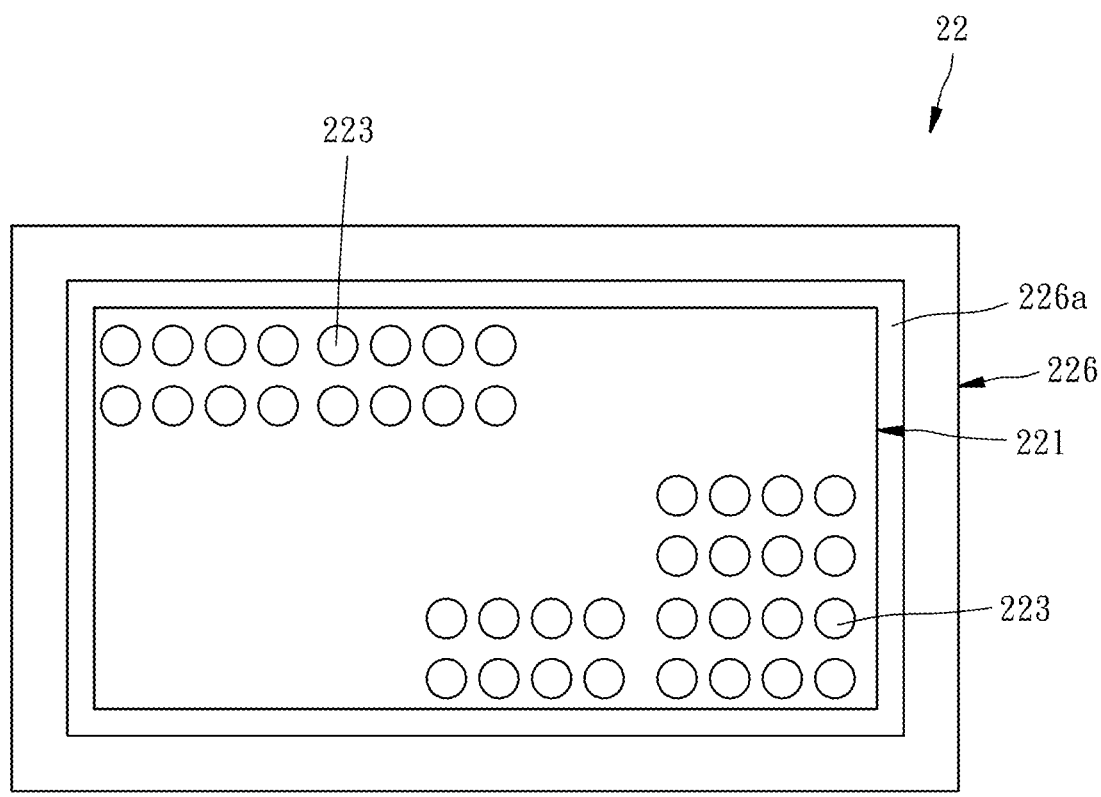
FIG. 7 is a schematic bottom view of a middle die of the probe head for high frequency signal test and medium or low frequency signal test at the same time according to the fourth preferred embodiment of the present invention.

Because the electric contacts of the DUT for transmitting high frequency signal are usually provided in the area near the periphery of the DUT, the second spring probes 40 for transmitting high frequency signal are also usually disposed in the area near the periphery of the probe seat 20. In such condition, the section of the middle die 22 having the multi-layer circuit board 221 to be abutted by the second spring probes 40 is obviously separated from the section of the middle die 22 having the middle through holes 223 through which the first spring probes 30 are to be inserted, as shown in FIG. 3. However, according to different testing requirements, it may still need first spring probes 30 to be disposed around the second spring probes 40, or the area the second spring probes 40 are arranged and the area the first spring probes 30 are arranged may be interlaced without obvious separation. In such condition, the shape of the multi-layer circuit board 221 can be designed according to the arrangement of the first and second spring probes 30 and 40. For example, a third preferred embodiment of the present invention is shown in FIG. 4 and FIG. 5, wherein FIG. 5 shows the outline of the multi-layer circuit board 221 but not showing the electrically conductive contacts 224. In the third preferred embodiment, the area of the installation surface 226a of the machinable plate 226 covered by the multi-layer circuit board 221 avoids the area having the middle through holes 223, so that the first spring probe 30 penetrates through only the machinable plate 226 but doesn't penetrate through the multi-layer circuit board 221. Alternatively, the area of the installation surface 226a of the machinable plate 226 covered by the multi-layer circuit board 221 may include one or more middle through holes 223, such as that in a fourth preferred embodiment of the present invention shown in FIG. 6 and FIG. 7, wherein FIG. 7 shows the outline and the middle through holes 223 of the multi-layer circuit board 221 but not showing the electrically conductive contacts 224. This means the aforementioned one or more middle through holes 223 penetrate through the machinable plate 226 and the multi-layer circuit board 221, so that the associated first spring probes 30 penetrate through the machinable plate 226 and the multi-layer circuit board 221.

Figure 8:
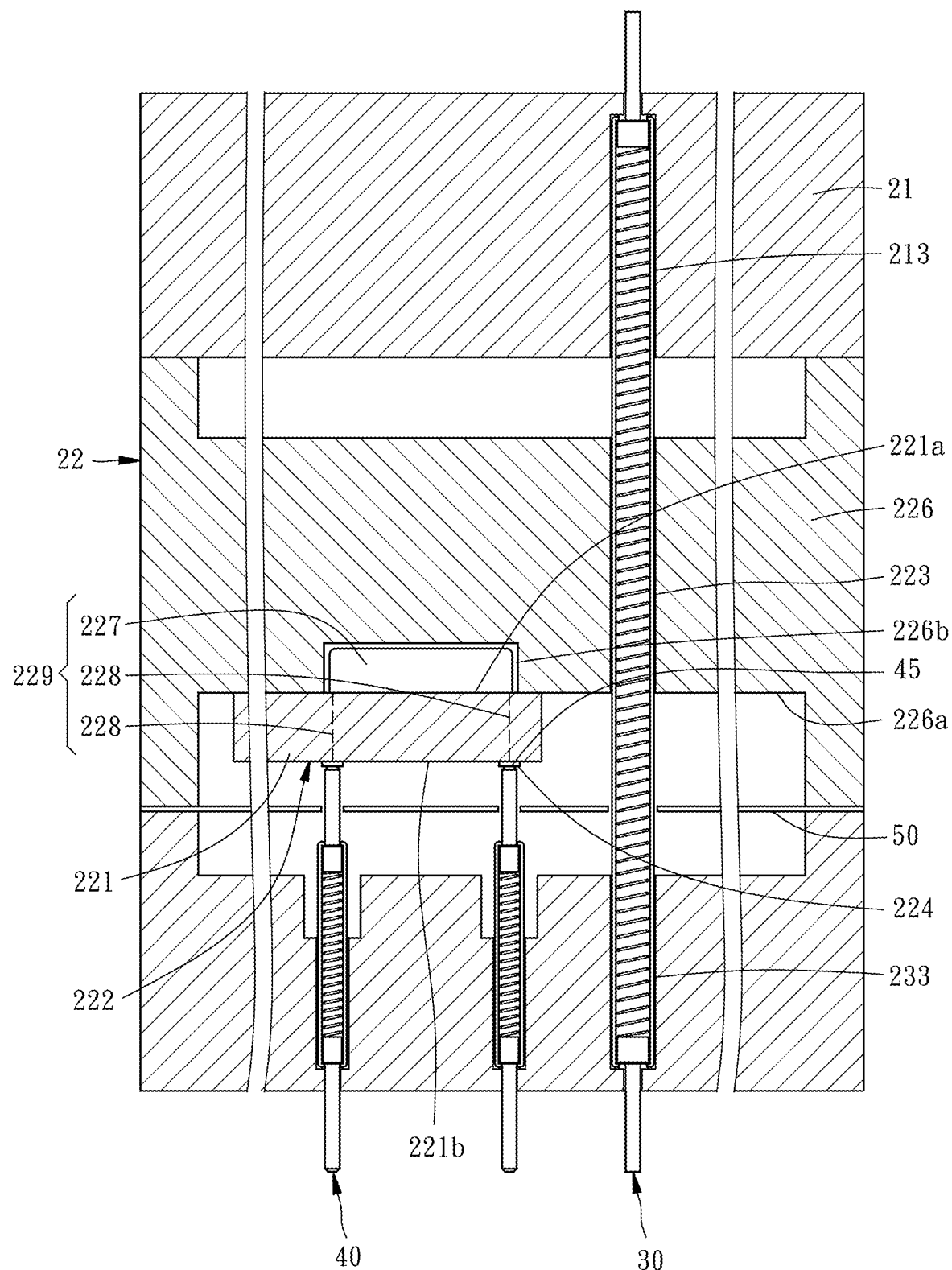
FIG. 8 is a schematic sectional view of a probe head for high frequency signal test and medium or low frequency signal test at the same time according to a fifth preferred embodiment of the present invention.

Referring to FIG. 8, a fifth preferred embodiment of the present invention is similar to the above-described second preferred embodiment, but the machinable plate 226 in this embodiment has a recess 226b provided on the installation surface 226a, and the connecting circuit 229 of the middle die 22 includes an electronic component 227 located on the top surface 221a of the multi-layer circuit board 221 and located in the recess 226b, and two internal wiring lines 228 located inside the multi-layer circuit board 221 and electrically connected with the electronic component 227. The two internal wiring lines 228 are electrically connected with the two electrically conductive contacts 224 located on the bottom surface 221b of the multi-layer circuit board 221, respectively. Two second spring probes 40 are electrically connected with each other in a way that the top ends 45 thereof are abutted against the two electrically conductive contacts 224, respectively. In this way, the high frequency test signal outputted from the high frequency signal transmission contact of the DUT is transmitted to the high frequency signal reception contact of the DUT through a second spring probe 40 (TX probe), an electrically conductive contact 224, an internal wiring line 228, the electronic component 227, the other internal wiring line 228, the other electrically conductive contact 224 and the other second spring probe 40 (RX probe) in order for high frequency signal loopback test. The electronic component 227 may be a capacitance, an inductance, a resistance or a combination of at least two of them. Such arrangement of the electronic component 227 is suitable especially for the condition that the electronic component is to be disposed very close to the probe. The electronic component 227 or the recess 226b is unlimited to be located right above the two second spring probes 40. By the layered wiring inside the multi-layer circuit board 221, each of the internal wiring lines 228 can extend in any direction, enabling the electronic component 227 to be disposed at any position on the top surface 221a of the multi-layer circuit board 221, thereby increasing the flexibility of the arrangement of the electronic component.

The above-described type of connecting circuit 229 composed by an electronic component 227 and two internal wiring lines 228 is applicable to other types of middle die 22, as long as the middle die 22 includes the machinable plate 226 and the multi-layer circuit board 221, such as the middle die 22 disclosed in the third or fourth preferred embodiment.

Like the internal wiring line 225 in the first preferred embodiment, the internal wiring line 225 or 228 in the above-described second to fifth preferred embodiments, which is included in the connecting circuit 225 or 229 electrically connecting two electrically conductive contacts 224, is completely located inside the multi-layer circuit board 221, and the two electrically conductive contacts 224 are provided on the bottom surface 221b of the multi-layer circuit board 221 to be respectively connected with two ends of the internal wiring line 225 or the two internal wiring lines 228. The two second spring probes 40 are electrically connected with each other in a way that the top ends 45 thereof are abutted against the two electrically conductive contacts 224, respectively.

As described above, the probe head 10 of the present invention can perform medium or low frequency test and high frequency signal loopback test by the relatively longer first spring probe 30 and the relatively shorter second spring probes 40 respectively at the same time. Therefore, in the precondition of preventing the probe card from too complicated circuit design, the present invention is adapted for high frequency signal test and medium or low frequency signal test at the same time, and meets the requirements of fine pitch and high frequency testing at the same time.

Figure 11:
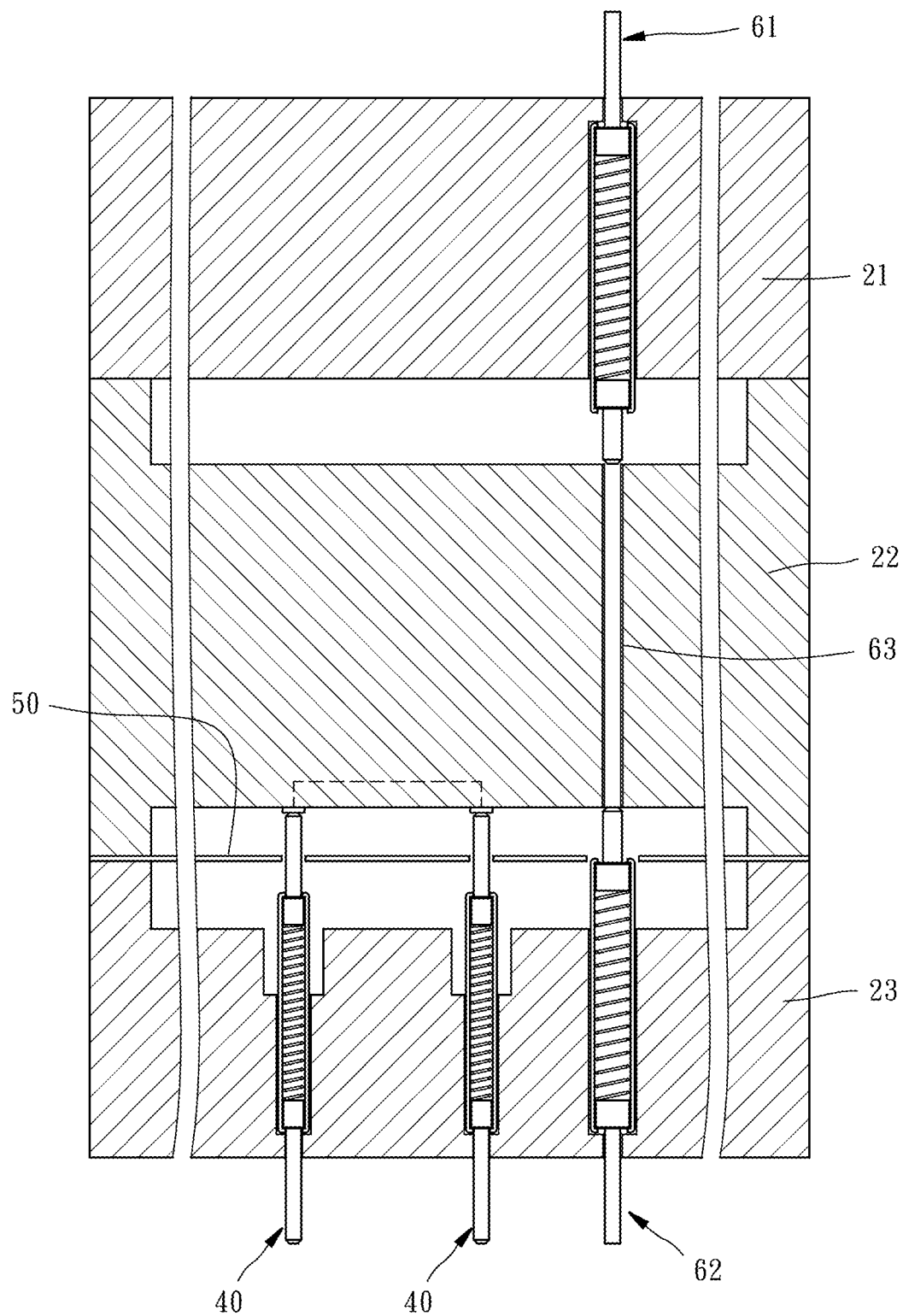
FIG. 11 is a schematic sectional view of a probe head for high frequency signal test and medium or low frequency signal test at the same time according to a sixth preferred embodiment of the present invention.

Besides, as a probe head according to a sixth preferred embodiment of the present invention as shown in FIG. 11, the probe head 10 of the present invention may have a structure including two relatively shorter spring probes and an inner circuit of the middle die to function like the first spring probe 30. Specifically speaking, this embodiment is similar to the above-described first preferred embodiment, but the first spring probe 30 is not shown, and the probe head 10 in this embodiment further includes a third spring probe 61 penetrating through the upper die 21 and a fourth spring probe 62 penetrating through the lower die 23. The third and fourth spring probes 61 and 62 are configured like the above-described first and second spring probes 30 and 40. The length of the third and fourth spring probes 61 and 62 is approximately equal to the length of the second spring probe 40, thereby much shorter than the first spring probe 30. The third and fourth spring probes 61 and 62 are electrically connected with each other through another connecting circuit 63 located inside the middle die 22. In this embodiment, the connecting circuit 63 is a conductive via plated on the inner surface thereof with a conductive layer. The third and fourth spring probes 61 and 62 are electrically connected with each other in a way that the bottom end of the third spring probe 61 and the top end of the fourth spring probe 62 are abutted against the top and bottom ends of the conductive via 63. Such structure composed of the third and fourth spring probes 61 and 62 and the connecting circuit 63 located inside the middle die 22 is also adapted for transmitting medium or low frequency signal or ground signal. This structure is also applicable to the second to fifth preferred embodiments.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe head for transmitting a first test signal and a second test signal higher in frequency than the first test signal, the probe head comprising:
   a probe seat comprising an upper die, a lower die and a middle die disposed between the upper die and the lower die, the middle die having a bottom surface facing toward the lower die and at least one conducting unit which comprises two electrically conductive contacts located on the bottom surface and a connecting circuit located inside the middle die and electrically connecting the two electrically conductive contacts;

a first spring probe penetrating through the upper die, the middle die and the lower die for transmitting the first test signal; and at least two second spring probes penetrating through the lower die for transmitting the second test signal, each of the second spring probes being shorter than the first spring probe and having a top end, two said second spring probes being electrically connected with each other in a way that the top ends of the two said second spring probes are abutted against the two electrically conductive contacts of the same conducting unit, respectively;

wherein the lower die has a top surface facing toward the middle die, a bottom surface opposite to the top surface, and at least one lower installation hole unit penetrating through the top surface and the bottom surface of the lower die; the lower installation hole unit comprises at least two lower installation holes and a communicating space communicating with said at least two lower installation holes; each of the lower installation holes accommodates one of the second spring probes; each of the second spring probes is partially located in the communicating space of the lower installation hole unit.

2. The probe head as claimed in claim 1, wherein the lower die has two said lower installation hole units; each of the lower installation hole units accommodates two said second spring probes arranged as a differential probe pair for differential signaling.

3. The probe head as claimed in claim 1, wherein the middle die comprises a multi-layer circuit board provided with the electrically conductive contacts; the connecting circuit comprises at least one internal wiring line located inside the multi-layer circuit board.

4. The probe head as claimed in claim 3, wherein the connecting circuit is one said internal wiring line.

5. The probe head as claimed in claim 3, wherein the middle die further comprises a machinable plate which has an installation surface facing toward the lower die; the multi-layer circuit board is fixed on the installation surface of the machinable plate.

6. The probe head as claimed in claim 5, wherein the machinable plate has a recess provided on the installation surface; the multi-layer circuit board has a top surface facing toward the installation surface and the recess of the machinable plat; the connecting circuit comprises an electronic component disposed on the top surface of the multi-layer circuit board and located in the recess of the machinable plate, and two said internal wiring lines electrically connected with the electronic component and electrically connected with the two electrically conductive contacts, respectively.

7. The probe head as claimed in claim 5, wherein the first spring probe penetrates through the machinable plate without penetrating through the multi-layer circuit board.

8. The probe head as claimed in claim 5, wherein the first spring probe penetrates through the machinable plate and the multi-layer circuit board.

9. The probe head as claimed in claim 1, further comprising a positioning film disposed between the middle die and the lower die; each of the first and second spring probes is inserted through a positioning hole of the positioning film.

10. The probe head as claimed in claim 1, wherein the lower installation hole unit comprises a recess recessed from the top surface of the lower die to provide the communicating space; the lower installation holes of the lower installation hole unit penetrate through a bottom surface of the recess and the bottom surface of the lower die.

11. The probe head as claimed in claim 10, wherein the recess of the lower installation hole unit has a non-circle cross-section, a length of a shortest side of which is larger than a sum of a pitch between the second spring probes located in the same recess and a largest diameter of the lower installation hole.

12. The probe head as claimed in claim 10, wherein the recess of the lower installation hole unit has a circle cross-section, a diameter of which is larger than a sum of a pitch between the second spring probes located in the same recess and a largest diameter of the lower installation hole.

13. The probe head as claimed in claim 10, wherein the lower die comprises a lower plate and an upper plate piled on a top surface of the lower plate; the lower installation holes penetrate through the top surface and a bottom surface of the lower plate; the upper plate has an upper through hole; the upper through hole and the top surface of the lower plate collectively form the recess of the lower installation hole unit.

14. The probe head as claimed in claim 1, wherein each of the lower installation holes comprises an upper section and a lower section; the communicating space is located between the upper section and the lower section of each of the lower installation holes; the upper section extends downwardly from the top surface of the lower die to the communicating space; the lower section extends upwardly from the bottom surface of the lower die to the communicating space.

15. The probe head as claimed in claim 14, wherein the lower die comprises a lower plate, a middle plate and an upper plate piled in order; the upper section and the lower section of each of the lower installation holes penetrate through the upper plate and the lower plate, respectively; the middle plate has a middle through hole in which the communicating space is provided.

16. The probe head as claimed in claim 15, wherein the middle through hole has a non-circle cross-section, a length of a shortest side of which is larger than a sum of a pitch between the second spring probes located in the same middle through hole and a largest diameter of the lower installation hole.

17. The probe head as claimed in claim 15, wherein the middle through hole has a circle cross-section, a diameter of which is larger than a sum of a pitch between the second spring probes located in the same middle through hole and a largest diameter of the lower installation hole.

18. The probe head as claimed in claim 1, further comprising a third spring probe penetrating through the upper die and a fourth spring probe penetrating through the lower die; the third spring probe and the fourth spring probe are electrically connected with each other through another connecting circuit inside the middle die.

* * * * *